United States Patent
Agarwal

(10) Patent No.: US 8,359,511 B2
(45) Date of Patent: Jan. 22, 2013

(54) METHOD AND SYSTEM FOR CONSTRUCTING AND DECODING RATELESS CODES WITH PARTIAL INFORMATION

(75) Inventor: Sachin Agarwal, Berlin (DE)

(73) Assignee: Deutsche Telekom AG, Bonn (DE)

( * ) Notice: Subject to any disclaimer, the term of this patent is extended or adjusted under 35 U.S.C. 154(b) by 998 days.

(21) Appl. No.: 12/325,489

(22) Filed: Dec. 1, 2008

(65) Prior Publication Data

US 2009/0150743 A1 Jun. 11, 2009

(30) Foreign Application Priority Data

Nov. 30, 2007 (EP) .................................... 07023243

(51) Int. Cl.
*G06F 11/00* (2006.01)
(52) U.S. Cl. .................. 714/751; 714/746; 714/752
(58) Field of Classification Search .................. 714/751, 714/752, 746, 799
See application file for complete search history.

(56) References Cited

U.S. PATENT DOCUMENTS

| | | | | |
|---|---|---|---|---|
| 6,307,487 B1 * | 10/2001 | Luby | ................................ | 341/50 |
| 6,373,406 B2 * | 4/2002 | Luby | ................................ | 341/50 |
| 7,137,060 B2 * | 11/2006 | Yu et al. | ........................ | 714/794 |
| 7,721,184 B2 * | 5/2010 | Luby et al. | .................... | 714/781 |
| 7,971,129 B2 * | 6/2011 | Watson et al. | ................. | 714/784 |

OTHER PUBLICATIONS

Amin Shokrollahi "Raptor Codes", IEEE Transactions on Information Theory, 52(6), pp. 1-35, 2006.
Michael Luby "LT Codes", The 43rd Annual IEEE Symposium on Foundations of Computer Science, 2002.
S. Roweis, "Erasure (deletion) Channels & Digital Fountain Codes", Nov. 2006, p. 1-5.
M. Luby, "LT Codes", $43^{rd}$. Annual Symposium on Foundations of Computer Science (FOCS 2002), Vancouver, BC, Canada, Nov. 2002, p. 1-10.
L.H. Charles Lee, "Error-Control Block Codes for Communications Engineers," 2000, p. 40-45.
Shu Lin et al., "Error Control Coding", Fundamentals and Applications, Second Edition, Prentice Hall, pp. 851-858 and 920-925, Jun. 7, 2004.
Nathan Jacobson, "Basic Algebra I", W.H. Freeman and Company, pp. 277-279, Aug. 8, 1974.

* cited by examiner

*Primary Examiner* — Scott Baderman
*Assistant Examiner* — Sarai Butler
(74) *Attorney, Agent, or Firm* — Leydig, Voit & Mayer, Ltd.

(57) ABSTRACT

A method for data transmission to a receiving host, the transmitted data being coded for forward error correction, includes providing a pre-defined set $X_k$ of symbols, having k symbols, at the transmitting host. An individual subset $X_n^h$ of the pre-defined set $X_k$, comprising $n_h$ symbols, is provided at each receiving host. An encoded symbol is calculated by the transmitting host based on a pre-defined rateless code. The calculated encoded symbol and the information with which symbols of set $X_k$ is associated is transmitted to each of the receiving hosts. The encoded symbol is decoded by each receiving host using a decoding algorithm based on a pre-defined rateless code. Repeating the steps until each receiving host has retrieved from the received encoded symbols the respective difference set of symbols.

19 Claims, 4 Drawing Sheets

METHOD AND SYSTEM FOR CONSTRUCTING AND DECODING RATELESS CODES WITH PARTIAL INFORMATION

CLAIM OF PRIORITY

This application claims the benefit of priority under 35 U.S.C. §119, of European Patent Application No. 07023243.4, filed Nov. 30, 2007, and hereby incorporated by reference in its entirety.

FIELD

The invention generally relates to error correction in communication and data storage and particularly to forward error correction using coded data transmission from a transmitting host to at least one receiving host.

BACKGROUND

In communication and storage systems the loss of data during transmission is a common problem. A widely applied technique for compensating data errors that occur during transmission is forward error correction (FEC). For FEC error control the sender adds redundant data to the messages sent, thereby allowing the receiver to detect and correct errors, so that no retransmission is needed.

Typically, a message of a given number of blocks is transformed into a forward error corrected message which comprises an overhead added to the original blocks, allowing the original message to be recovered, even if only a subset of the blocks of the forward error corrected message are correctly received. In many FEC codes the ratio of message data and overhead is fixed, so that depending on the expected error rate typically different codes with different overhead sizes are utilized.

So-called rateless codes are more flexible, since they have the property of generating a potentially limitless sequence of encoding symbols from a given set of source symbols, such that the original source symbols can be recovered from any subset of the encoding symbols of equal or slightly larger size than the number of source symbols. Today, rateless codes are well known tools used to transmit information, i.e. input symbols, as encoded symbols over lossy communication channels in order to protect the information from channel losses. Rateless codes are also used to store and replicate information on storage devices, where the original input symbols are stored as encoded symbols, and can be extracted from encoded symbols when needed. When some of the encoded symbols are corrupted or otherwise unavailable due to storage device and/or read errors, the input symbols can still be extracted from the encoded symbols provided that an adequate number of encoded symbols is available to the decoding host.

The key to the successful functioning of rateless codes is that the information in the input symbols is spread across the encoded symbols. Then, given a sufficient number of encoded symbols, all the input symbols can be decoded from these encoded symbols, irrespective of the particular encoded symbols available to the decoding host. Therefore, irrespective of any particular encoded symbol(s) lost in the communication channel or storage device, the input symbols can be recovered as long as an adequate number of encoded symbols is available to the decoding host.

These codes are called rateless codes because of their design—the encoding host can practically produce an unending stream of encoded symbols as required—to use later. Rateless codes sometimes impose a small overhead because the number of encoded symbols required at the decoding host is slightly more than the total number of input symbols. In addition, there is the small overhead of transmitting meta-information needed for recovering the input symbols at the decoding host.

Random linear codes are a class of rateless codes known to have a very low communication overhead, in fact they can be designed so that the number of encoded symbols required for decoding is almost always equal to the number of input symbols. However, they are computationally expensive in encoding and decoding operations, and as such, impractical for a large number of input symbols.

In U.S. Pat. No. 6,373,406 B2 LT codes (Luby transform codes) are described, which have recently become popular because of their low encoding and decoding complexity, which however is achieved at the cost of a slightly larger communication overhead as compared to random linear codes. LT codes, when enhanced with an outer code, form the basis for Raptor codes, recently proposed for large scale information distribution in wireless networks and described in "Raptor Codes" by A. Shokrollahi, IEEE Transactions on Information Theory, 52(6), 2551-2567, 2006.

However, all the above described codes for forward error correction are designed for transmitting data from a transmitting host to a receiving host, wherein the receiving host has no prior information about the data to be transmitted. In particular, the described codes are not adapted for transmitting incremental data changes.

SUMMARY

It is therefore an aspect of the present invention to provide improved data transmission using forward error correction based on rateless codes. It is an additional, alternative, aspect of the invention to provide an improved way for transmitting incremental data changes from a transmitting host to a receiving host.

In an embodiment, the present invention provides a method for data transmission from a transmitting host to at least one receiving host, wherein the transmitted data is coded for forward error correction. The method includes the steps of: a) providing a pre-defined set $X_k$ of symbols, comprising k symbols, at the transmitting host; b) providing an individual subset $X_n^h$ of the pre-defined set $X_k$, including $n_h$ symbols, at each of the at least one receiving host, wherein $h \in \{1, \ldots, H\}$ with H equaling a number of the at least one receiving host; c) calculating an encoded symbol by the transmitting host by using an encoding algorithm based on a pre-defined rateless code depending on the pre-defined set $X_k$ of symbols, wherein the encoded symbol is associated with at least one randomly selected symbol of the set $X_k$, and wherein the number of symbols of set $X_k$ which are associated with the encoded signal is determined by using a discrete probability density $P^*_k$ having k components with a sum of 1; d) transmitting, to each of the at least one receiving host, the calculated encoded symbol and information regarding which of the symbols of the set $X_k$ the calculated encoded symbol is associated with; e) decoding the encoded symbol by each of the at least one receiving host using a decoding algorithm based on a pre-defined rateless code and corresponding to the encoding algorithm, and f) repeating steps c) through e) until each of the at least one receiving host has retrieved from the received encoded symbols a respective difference set of symbols ($X_k - X_n^h$).

In another embodiment, the invention provides a pre-encoding device for forward error correction encoding of data to be transmitted from a transmitting host to at least one receiving host, wherein a pre-defined set $X_k$ of symbols, including k symbols, is provided at the transmitting host, an individual subset $X_n^h$ of the pre-defined set $X_k$, including $n_h$ symbols is provided at each of the at least one receiving host, wherein $h \in \{1, \ldots, H\}$ with H being a number of the at least one receiving host, and the forward error correction encoding is performed using a pre-defined rateless encoding algorithm. The pre-encoding device includes: a calculating device configured to calculate a probability density $P^*_k$ from a pre-defined probability density $P_{k-n}$, wherein said probability density $P_{k-n}$ has k-n components with a sum of 1 and said probability density $P^*_k$ has k components with a sum of 1.

In yet another embodiment, the invention provides a pre-decoding device for decoding forward error corrected data received from a transmitting host, wherein the forward error corrected data includes: at least one encoded symbol which is encoded by means of a pre-defined rateless encoding algorithm depending on a pre-defined set $X_k$ of symbols, including k symbols, wherein the encoded symbol is associated with at least one randomly selected symbol of the set $X_k$; and information with which of the symbols of set $X_k$ the at least one encoded symbol is associated. The pre-decoding device includes: a symbol determining device configured to determine the symbols which are associated with the received at least one encoded symbol and are a member of a pre-defined subset $X_n^h$ of the symbols, and a subtracting device configured to subtract the determined symbols from the received encoded symbol.

DETAILED DESCRIPTION

Figure 1:
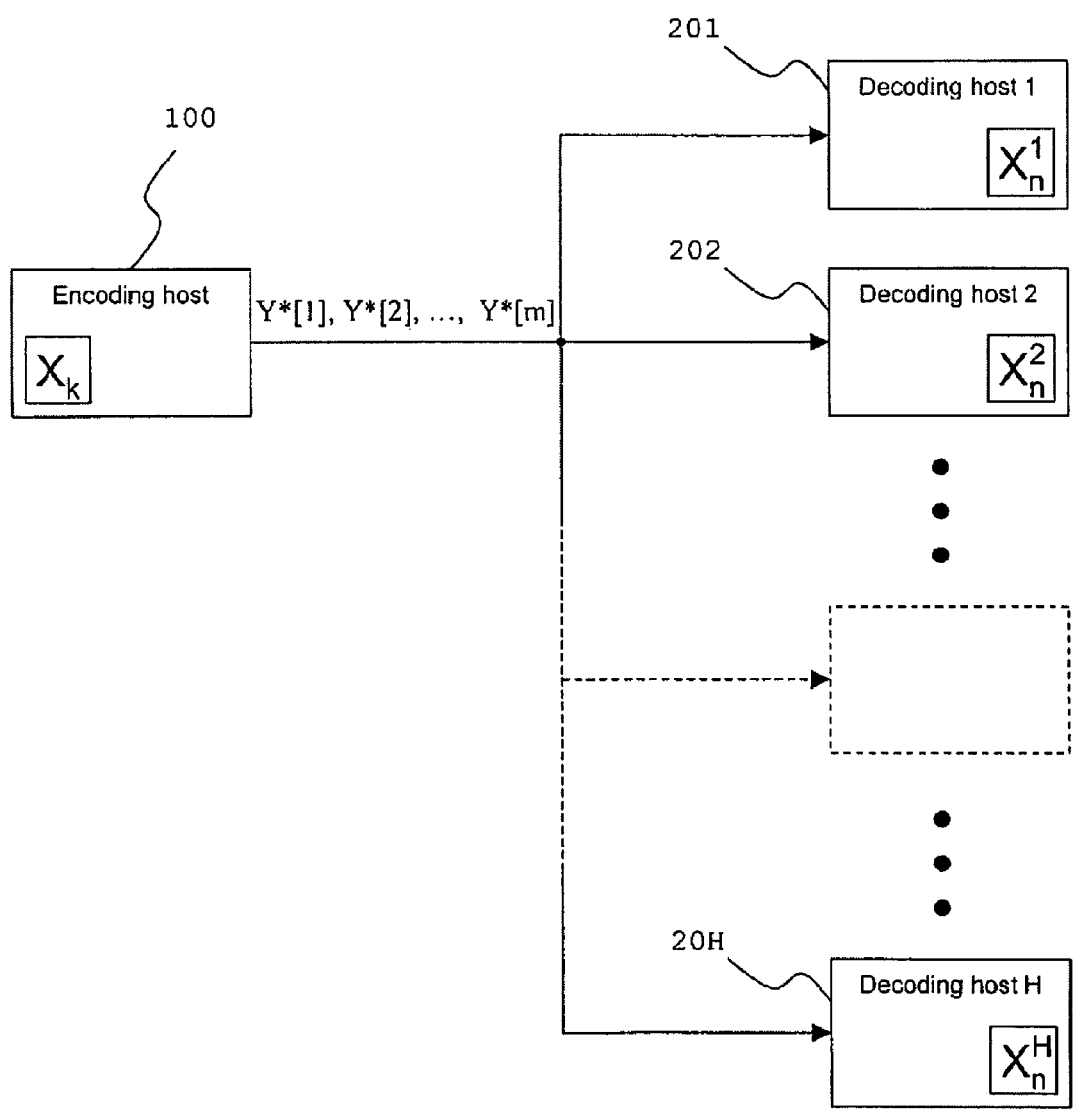
FIG. 1 schematically illustrates an embodiment of an inventive transmission system, FIG. 2 schematically illustrates device components in accordance with the embodiment of FIG. 1, FIG. 3 graphically illustrates a modified probability density P* as compared to an original probability density typically used with a known rateless code, and FIG. 4 graphically illustrates, for an embodiment in accordance with the invention, the number of transmitted encoded symbols required at the decoding host for decoding the set $X_k$ of input symbols depending on the number of input symbols known by the decoding host prior to transmission.

By way of overview and introduction, an embodiment of the invention provides a method for data transmission from a transmitting host to at least one receiving host provides for the transmitted data to be coded for forward error correction (FEC), wherein a pre-defined set $X_k$ of symbols, comprising k symbols, is provided at the transmitting host, and an individual subset $X_n^h$ of said pre-defined set $X_k$, comprising $n_h$ symbols is provided at each receiving host, wherein $h \in \{1, \ldots, H\}$ with H the number of receiving hosts.

For the purpose of generating the coded data to be transmitted the method comprises the steps of calculating an encoded symbol by the transmitting host by means of an encoding algorithm based on a pre-defined rateless code depending on the pre-defined set of symbols $X_k$, wherein the encoded symbol is associated with at least one randomly selected symbol of the set $X_k$, and wherein the number of symbols of set $X_k$ which are associated with the encoded signal is determined by means of a discrete probability density $P^*_k$ having k components with a sum of 1, of transmitting the calculated encoded symbol and the information with which symbols of set $X_k$ it is associated to each of the receiving hosts, and of decoding the encoded symbol by each receiving host by means of a decoding algorithm based on a pre-defined rateless code and corresponding to said encoding algorithm, wherein these steps are repeated until each receiving host has retrieved from the received encoded symbols the respective difference set of symbols $(X_k - X_n^h)$.

Known rateless codes are designed for the case when the decoding host has no other information about the input symbols. In contrast to that, embodiments of the invention address the case when the decoding host already has a subset of input symbols, i.e. some of the input symbols, wherein the encoding host may also have some information about the information known at the decoding host. In such a case the known rateless codes lead to inefficient encoding, transmission and decoding operations.

These embodiments thus modify the construction and decoding of well-known rateless codes used for forward error correction in communication and data storage, which are used to recover data lost in a communication system, to protect stored data from errors in storage devices, and other related applications.

The various embodiments of the invention take advantage of partial information already available at the recipient of the information, i.e. the receiving or decoding host, in order to reduce the net amount of information transferred from the provider of the information, i.e. the transmitting or encoding host, and accurately reproduce the complete information at the decoding host. The recovery of data under such situations is more efficient in terms of the communication and computational overhead.

In a preferred embodiment the input symbols, i.e. the symbols of set $X_k$, are key-value pairs of a database that was modified at the encoding host and these modifications need to be transmitted to the decoding host or hosts. Since these modifications to the database typically are incremental, the number of differences between the databases stored on the encoding host and on any decoding host are far less than the total size of the database. Therefore it is wasteful to transfer the entire database from the encoding host to the decoding host or hosts.

In another preferred embodiment mobile devices act as decoding hosts for updating a dataset to a newer version available at a broadcasting server acting as the encoding host without downloading the whole new dataset.

The various embodiments provide a procedure to modify these well known rateless codes, as for instance random linear codes, LT codes, their derivatives, and the like, so that the additional (any or all) information about the input symbols available at the decoding host can be utilized in order to make the overall process of transferring all the input symbols to the decoding host more efficient in terms of reducing the total communication and the number of computation operations needed to recover the input symbols from the encoded symbols at the decoding host.

For this purpose, preferably a pre-defined number n is provided and the probability density $P^*_k$ is calculated by the transmitting host from a pre-defined probability density $P_{k-n}$ having k-n components with a sum of 1. The probability density $P_{k-n}$ is a probability density typically used by a known rateless code for a set of k-n input symbols. An essential feature of the invention is the modification of this pre-defined probability density $P_{k-n}$ yielding the modified probability density $P^*_k$.

Most preferably, the probability density $P^*_k$ is denser than the probability density $P_{k-n}$. Furthermore, the probability density $P^*_k$ is also denser than a probability density $P_k$ typically used by a known rateless code for a set of k input symbols. Thereby the most advantage can be taken of the individual subsets $X_n^h$ being already present on the respective receiving hosts.

In a preferred embodiment the probability density $P^*_k$ is calculated from the probability density $P_{k-n}$ using the equation $$P^*_k[j] = P^*_k[j] + \sum_{\text{constraints}} P_{k-n}[i] \text{ for } 1 \leq j \leq k, \quad (1)$$

and $P^*_k[j] = 0$ for all $j$, $1 \leq j \leq k$ initially wherein the summation constraints are defined as:

$$1 \leq i \leq (k-n); \text{round}\left(\frac{i}{1-\frac{n}{k}}\right) = j.$$

With a probability density $P^*_k$ calculated with equation (1) a most efficient transmission can be achieved for a situation, wherein the number of symbols of the individual subsets $X_n^h$ equals n.

The method further preferably is adapted for a flexible broadcast transmission, wherein for at least two of the H receiving hosts the symbols of the respective individual subsets $X_n^h$ and/or the number of symbols $n_h$ in the respective individual subsets $X_n^h$ differ from each other.

Accordingly, n preferably is an estimate of the respective values of $n_h$ defining the number of symbols of the individual subsets $X_n^h$, wherein in particular n is an estimate of the minimum of all $n_h$.

Prior to decoding a received encoded symbol each receiving host preferably performs the steps of determining the symbols which are associated with the received encoded symbol and are a member of the respective individual subset $X_n^h$ provided at the respective receiving host, and subtracting the determined symbols from the received encoded symbol. That way the actual decoding can be performed by means of a decoding algorithm based on a pre-defined rateless code. With advantage the pre-defined rateless code can be for instance a random linear code, an LT code or any other suitable, also future rateless code.

Each receiving host preferably combines the respective provided set of symbols $X_n^h$ with the respective retrieved set of symbols $(X_k - X_n^h)$ resulting in the set of symbols $X_k$. The method therefore enables an efficient transmission of incremental changes in the set of symbols $X_k$ from the transmitting host to several receiving hosts, wherein the incremental changes with respect to the respective individual sets of symbols $X_n^h$ present at the respective receiving hosts can be different for different receiving hosts and still update yielding $X_k$ is achieved with the same encoded symbols broadcasted simultaneously to all receiving hosts. Methods embodying the invention can therefore be utilized with advantage in a variety of applications, as for instance in wireless transmission systems.

Depending of the application scenario the symbol size used for performing the method can vary broadly, ranging from the minimum of one bit to symbol sizes in the range of kByte, Mbyte or above. In a preferred embodiment the symbol size is one byte. In another preferred embodiment the symbol size is larger than one byte, in particular larger than 10 bytes, in particular larger than 100 bytes, in particular larger than 1000 bytes.

The method embodying the invention comprises the encoding and decoding of symbols, wherein the encoding preferably is performed by means of a pre-encoding step followed by an encoding step, and the decoding preferably is performed by means of a pre-decoding step followed by a decoding step. Therein the pre-encoding and pre-decoding steps are the most essential for the invention. Accordingly also a pre-encoding device and a pre-decoding device lie within the scope of the invention.

A pre-encoding device for forward error correction encoding of data to be transmitted from a transmitting host to at least one receiving host, wherein a pre-defined set $X_k$ of symbols, comprising k symbols, embodying the invention is provided at the transmitting host, an individual subset $X_n^h$ of said pre-defined set $X_k$, comprising $n_h$ symbols is provided at each receiving host, wherein $h \in \{1, \ldots, H\}$ with H the number of receiving hosts, and said forward error correction encoding is performed by means of a pre-defined rateless encoding algorithm, comprises means for calculating a probability density $P^*_k$ from a pre-defined probability density $P_{k-n}$, wherein said probability density $P_{k-n}$ has k-n components with a sum of 1 and said probability density $P^*_k$ has k components with a sum of 1.

The probability density $P^*_k$ preferably is calculated from the probability density $P_{k-n}$ using the equation (1) given above, and again n preferably is an estimate of the respective values of $n_h$ defining the number of symbols of the individual subsets $X_n^h$, in particular n is an estimate of the minimum of all $n_h$.

A pre-decoding device for decoding forward error corrected data received from a transmitting host, wherein said data comprises at least one encoded symbol which is encoded by means of a pre-defined rateless encoding algorithm depending on a pre-defined set of symbols $X_k$, comprising k symbols, wherein said encoded symbol is associated with at least one randomly selected symbol of the set $X_k$, information with which symbols of set $X_k$ the encoded symbol is associated, in accordance with the invention comprises determining device for determining the symbols which are associated with the received encoded symbol and are a member of a pre-defined subset $X_n^h$ of symbols and subtraction device for subtracting the determined symbols from the received encoded symbol.

Preferably the subtracting device is adapted to alter the information with which symbols of set $X_k$ the encoded symbol is associated by removing the information which defines the encoded symbol to be associated with the determined symbols.

A transmission system for transmitting data with forward error correction embodying the invention comprises a transmitting host and at least one receiving host, wherein the transmitting host comprises a pre-encoding device as described above and an encoding device adapted for encoding data by means of an encoding algorithm based on a pre-defined rateless code, and each receiving host comprises a pre-decoding device as described above and a decoding device adapted for decoding data by means of a decoding algorithm based on a pre-defined rateless code and corresponding to said encoding algorithm. As described above, the pre-defined rateless code can be any known rateless code, as for instance a random linear code, an LT code, a Raptor code, or derivatives thereof.

The generic structure of some well known rateless codes, such as the random linear codes and LT codes, and the general methods of encoding and decoding are well known in Coding Theory literature, see for instance "Error Control Coding" by S. Lin and D. J. Costello, Prentice-Hall, second edition.

The encoding host has a set of k input symbols $X_k=X[1]$, $X[2], \ldots X[k]$. The encoding process is used for creating m encoded symbols that are then stored in set $Y_m=Y[1]$, $Y[2], \ldots Y[m]$, wherein $m \geq k$, the exact value depending on the rateless code being used. Note that each element of the sets $X_k$ and the $Y_m$ is indexed and is uniquely identified by this index. Each of the k input symbols $X[1], X[2], \ldots X[k]$ is represented as an element of a Finite Field as described for instance in "Basic Algebra I" by N. Jacobson, W. H. Freeman and Co., second edition. For mathematical convenience and all mathematical operations such as additions and subtractions used to derive the encoded symbols are performed in this Finite Field. Therefore, each encoded symbol also belongs to the chosen Finite Field. In this application text, this aspect is assumed to be inherent to all the mathematical notions without being expressed overtly.

A probability density vector $P_k=P[1], P[2], \ldots P[i], \ldots, P[k]$, used to create the rateless code, is the defining characteristic of the code. In the following the terms probability density vector and probability density are used synonymously. The subscript k of $P_k$ denotes the number of values in the probability density that can be non-zero. So each probability value $P[i]$, $1 \leq i \leq k$, is a number between 0 and 1 (inclusive), and further, the sum of these probability values, $P[1]+P[2]+\ldots+P[k]=1$.

From the probability density $P_k$, the cumulative density distribution $C_k=C[0], C[1], C[2], \ldots, C[k]$ is computed on the encoding host as follows:
1. Set $C[0]=0$
2. Set $C[i]=C[i-1]+P[i]$ for all $i=1, 2, 3, \ldots, k$ The encoding process uses this cumulative density $C_k$ and input symbol set $X_k$ to create m encoded symbols in the following way:
1. A random number r between 0 and 1 is generated, i.e, $0<r \leq 1$.
2. The interval in $(C[i]$ to $C[i+1])$ in which r exists is determined, i.e., $C[i]<r \leq C[i+1]$.
3. The degree d of the encoded symbol Y being constructed is set to i.
4. d input symbols are selected at random from the k possible choices of the input symbols.
5. These d input symbols are summed to obtain the encoded symbol Y.
6. Y is added to the encoded symbol set $Y_m$.
7. Steps 1 to 6 are repeated m times to create the m encoded symbols that form the encoded symbol set $Y_m$.

The key parameter of the rateless code is the probability distribution P, because it influences the degree of encoded symbols. This has an effect on the computational resources required to create the encoded symbols and later recover the input symbols from the encoded symbols. Moreover, the success of some decoding algorithms is related to the degree, as described for instance in "LT Codes" by M. Luby, The 43rd Annual IEEE Symposium on Foundations of Computer Science, 2002. The random linear code uses a uniform distribution while the LT code uses a robust solution distribution.

In the decoding process, the decoding host collects at least k encoded symbols and then solves the linear equations comprising the encoded symbols for the unknowns, i.e, the set of input symbols $X_k$.

The critical advantage of the rateless codes is that as soon as an adequate number of encoded symbols have been received, the decoding host can recover the set of input symbols in set $X_k$, irrespective of which particular encoded symbols are obtained. Or conversely, no matter which encoded symbols are lost in the lossy communication channel or erroneous storage device, the decoding host can recover all the input symbols given an adequate number of encoded symbols.

Based on the above brief description of encoding and decoding processes of rateless codes known from the prior art, embodiments of the invention that improve rateless codes when certain conditions are met are now described.

For the setup of one transmitting host and one receiving host, these conditions comprise the encoding host having k input symbols forming set $X_k$, n of which are already known at the decoding host, wherein these known input symbols form the set $X_n$. The n known symbols are from among the k input symbols, so $X_n \subset X_k$, which means that the set $X_n$ is contained in set $X_k$ because every element of set $X_n$ is in $X_k$. The encoding host preferably has some information about the value of n, for instance an approximate or estimated value, but typically has no information about which n input symbols are known at the decoding host. The encoding host seeks to transfer the difference set $X_k-X_n$, the set of all elements in $X_k$ that are not in $X_n$, to the decoding host efficiently. Efficient transfer means that the number of symbols transmitted by the encoding host are close to k−n, and the computational complexity—the number of mathematical operations required to encode and decode—approach a provable mathematical lower bound for the total communication required.

It is to be noted that until now, rateless codes known from the prior art have only been designed and used for the case when the decoding host has no information about the input symbol set $X_k$. The design of rateless codes are modified for better performance in the case, when some input symbols are already known at the decoding host, i.e., the set $X_n$ is not empty.

In a preferred embodiment of the invention a broadcasting scenario as shown in FIG. 1 is provided, comprising one encoding host 100 that wants to broadcast set $X_k$ to multiple decoding hosts 201, 202, ..., 20H, each of which already have different subsets $X_n^1, X_n^2, \ldots, X_n^H$ of $X_k$. Preferably the different subsets $X_n^1, X_n^2, \ldots, X_n^H$ comprise approximately the same number of elements. In such a scenario using a rateless code is very beneficial, because the different sets of missing elements on all the decoding hosts 201, 202, ... 20H can be recovered using the same encoded symbols $Y^*[1]$, $Y^*[2], \ldots, Y^*[m]$ broadcast by the encoding host 100.

Conventional rateless codes are modified to reduce the total number of encoded symbols transferred from the encoding host and the total number of computations performed at the encoding and decoding host or hosts in order to encode and recover all the k input symbols at the decoding host or hosts. The modification of conventional rateless codes is implemented by creating a probability density P* and by modifying the decoding process. The new probability density P*, described in more detail later, is used to create encoded symbols using the encoding process described above with respect to the known rateless codes. The encoding host holds the input symbol set $X_k$ of k set elements. It also has a good, though possibly inexact, estimate n of the number of input symbols known a priori at the decoding host or hosts. The encoding host and decoding host or hosts agree on using a particular rateless code with a particular probability density.

The decoding process at each decoding host is preceded by subtracting symbols in the respective set $X_n^h$, $h \in \{1, \ldots, H\}$, from each of the received encoded symbols $Y^*_m=Y^*[1]$, $Y^*[2], \ldots, Y^*[m]$ to yield residual encoded symbols $Y'_m=Y'[1], Y'[2], \ldots, Y'[m]$. These modified encoded symbols are then decoded according to the rateless code's original decoding process, as described above with respect to the known rateless codes, to yield the difference set $X_k-X_n^h$. Finally, the union of this set $X_k-X_n^h$ and the set $X_n^h$, available a priori at the respective decoding host yields the required $X_k$ at the respective decoding host.

The new P* is constructed in a way that ensures that the residual encoded symbols Y'[1], Y'[2], ..., Y'[m] follow the original probability distribution $P_{k-n}$, and hence can be subsequently decoded using the usual decoding techniques for rateless codes. The key to the efficiency is that this subsequent decoding is equivalent to decoding only k–n input symbols at the decoding host. The decoding of a smaller number of input symbols, i.e k–n as compared to k, is more efficient than when the original rateless code is used without modification, and results in significantly reduced communication from the encoding host and computation at the decoding host.

The inefficiency of creating the encoded symbols using the original probability distribution $P_k$ occurs, because the encoded symbols that are constructed from input symbols in set $X_n$ hold redundant information. The probability $P^*_k$ is appropriately constructed so that the occurrences of such redundant encoded symbols are reduced, thus increasing the overall efficiency.

The basic idea used to construct $P^*_k$, which the inventors found to be most advantageous, is that by making the probability distribution denser as compared to $P_k$, i.e., by decreasing the probability of having a fewer number of input symbols associated with the encoded symbol and correspondingly increasing the probability of having more input symbols associated with the encoded symbols on average, redundant encoded symbols can be reduced. These new probabilities are comprised in the probability distribution $P^*_k$ that characterizes the new, more efficient code. The specific methodology for making the probability distribution optimally denser is explained below.

Figure 2:
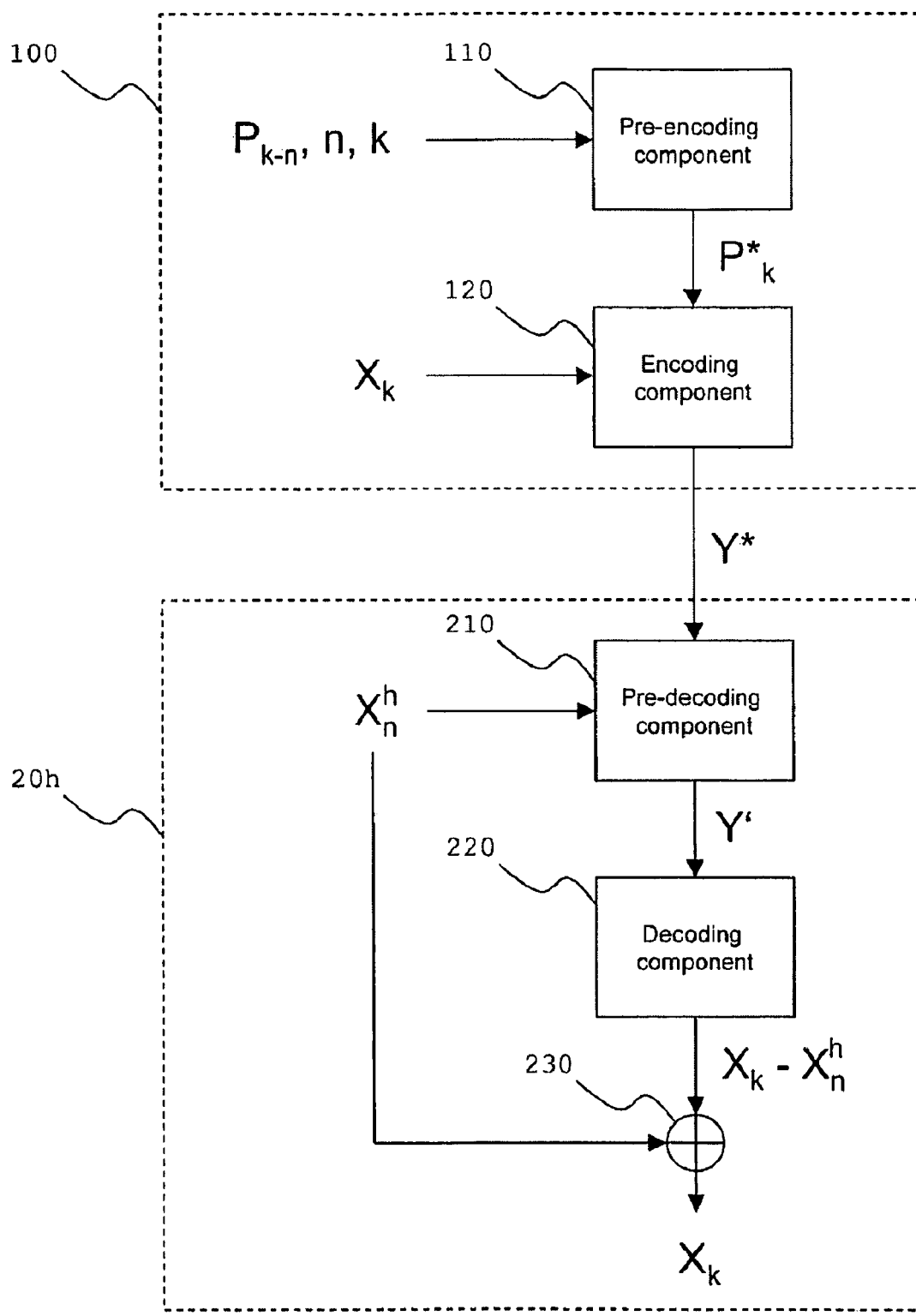

In FIG. 2 the preferred setup of an inventive transmission system of FIG. 1 is shown in more detail, wherein the encoding host 100 and one exemplary decoding host 20h is shown. The exemplary receiving host 20h can be any one of the receiving hosts 201, 202, ..., 20H of FIG. 1.

In the shown embodiment the pre-encoding component 110 and the pre-decoding component 210 perform the steps which are provided for modifying the mechanism of known rateless code, wherein the encoding component 120 and the decoding component 220 essentially perform the original encoding and decoding process according to a pre-defined rateless code, as for instance an LT code. Therefore basically the separate components 110 and 210 are added to conventional rateless codes. However, the shown setup primarily is chosen for clarification purposes, in order to distinguish the features of the invention which go beyond the functionality of known rateless codes. Therefore, components 110 and 210 need not be provided as separate components, but can also advantageously be integrated in the encoding component 120 and the decoding component 220 respectively. Accordingly, the pre-encoding component 110 performs a pre-encoding before the encoding host 120 creates the encoded symbols using the original encoding process, and the pre-decoding component 210 performs a pre-decoding before the decoding host 220 decodes the encoded symbols back into the input symbols using the original decoding process.

FIG. 2 shows where these components are arranged in the encoding host 100 and decoding hosts' 20h conventional encoding and decoding components 120 and 220 respectively. The decoding host also executes an additional post-decoding step of combining its known input symbol set $X_n^h$ with the decoded set of unknown input symbols set $X_k-X_n^h$ in order to obtain the final set $X_k$ at the decoding host 20h with appropriate combining means 230.

The encoding host 100 takes the inputs $X_k$, k, n and $P_{k-n}$ to create a set of m encoded symbols $Y^*_m$. In order to do this, the pre-encoding component 110 first computes a modified probability distribution $P^*_k$ from $P_{k-n}$, and the subsequent encoding component 120 uses this $P^*_k$ and input symbols set $X_k$ in order to create the set of encoded symbols $Y^*_m$.

This set of encoded symbols $Y^*_m$ is subsequently transferred to the decoding host 20h. The decoding host 20h uses the pre-decoding component 210 to modify the elements of the received set $Y^*_m$ to obtain $Y'_m$, based upon knowledge of the set of known input symbols $X_n$. The output of the pre-decoding component 210 is used by the decoding components of the original rateless code to recover the set $X_k-X_n^h$ using the normal decoding process for the original code. Finally, the union of set $X_n^h$ and set $X_k-X_n^h$ yields the set of input symbols $X_k$ at the decoding host 20h.

The pre-encoding component 110 and the pre-decoding component 210 of the shown exemplary embodiment are described in more detail below.

Pre-encoding Component

The parameters k and n store the values of the number of input symbols in set $X_k$ and the number of known input symbol set $X_n^h$ at the decoding host 20h respectively. It is assumed that the encoding host 100 knows or estimates n through some out-of-band technique. Further, it is assumed that the encoding host 100 uses a rateless code with a probability distribution of $P_{k-n}$ defined for k–n values, i.e., P[i] may be non-zero only for $1 \leq i \leq k-n$. It is to be noted that because $P_{k-n}$ is a probability density, the sum of its components equals 1, i.e. $\Sigma P[i]=1$.

The steps for the construction of a modified probability distribution P*, starting with the probability distribution $P_{k-n}$, are presented in the following:

1. As noted above, the parameters k and n store the values of the number of input symbols and the number of known input symbols at the decoding host respectively.
2. P[1], P[2], ..., P[k–n] denote the probability values in the probability density $P_{k-n}$
3. Initially, it is set $P^*[j]=0$ for all j, $1 \leq j \leq k$
4. For all values of i from 1 to k–n, it is computed $$P^*[j] = P^*[j] + P[i], \text{ such that round}\left(\frac{i}{1-\frac{n}{k}}\right) = j,$$

wherein the round( ) function rounds a decimal number to the nearest integer.

It is to be noted that after completing step 4 above, P*[j] may be non-zero for any $1 \leq j \leq k$, depending on the values of n and k. Hence the correct subscript of P* is $P^*_k$.

Note that there may be no value of i such that round $$\left(\frac{i}{1-\frac{n}{k}}\right) = j,$$

and correspondingly,

P*[j]=0 at this particular value of j.

It is further to be noted that the denominator of $$\left(\frac{i}{1-\frac{n}{k}}\right)$$

is necessarily less than 1 and therefore, the quantity $$\left(\frac{i}{1-\frac{n}{k}}\right) > i,$$

ignoring the special cases of n=0 and n=k, the former because the original rateless code can then be used unaltered, and the latter because the decoding host already has all the k input symbols and hence the transfer of information is not applicable. This means that the probability density is being "shifted" to the right with more weight being assigned to the higher indices of P*. Doing so means that the degree of encoded symbols increases on average as compared to the original rateless code constructed in a way as described above with respect to known rateless codes, thus reducing the possibility of redundant encoded symbols and making the new code created using P* more efficient.

Also note that since $$\left(\frac{i}{1-\frac{n}{k}}\right) > i$$

always, the equation to update P*[j] can be expressed more concisely as
P*[j]=P[i], such that round $$\left(\frac{i}{1-\frac{n}{k}}\right) = j,$$

wherein the round( ) function rounds a decimal number to the nearest integer. The more verbose form introduced at the beginning of (4.) above highlights that the initial value of P*[j] is set to 0.

The reason for rounding off $$\left(\frac{i}{1-\frac{n}{k}}\right)$$

is that the indices of P* and the degrees of encoded symbols cannot be decimals or fractions, they can only be positive integers greater than or equal to 1.

The subsequent encoding process can be exactly as that for the original rateless code, except that now $P^*_k$ is used to create the encoded symbols on the encoding host 100 instead of $P_k$.

Pre-decoding Component

The encoded symbol set Y* received by the decoding host 20h is first pre-processed and converted into another encoded symbol set Y' suitable for subsequent application of the normal decoding process for the original rateless code. As mentioned earlier, the decoding host 20h knows the set $X_n^h$ through some out-of-band technique and/or through some meta-data transmitted to the decoding host in the packets containing the encoded symbols. Further, each encoded symbol Y* carries meta-data information about the input symbols that were used to create it.

The pre-decoding component 210 at the decoding host 20h applies the steps enlisted below on Y*:
1. Any element of set $X_n^h$ that was used to create any element of Y* is subtracted from that element of Y*, to yield set Y'.
2. This set Y' is then used as an input to the decoding algorithm of the original rateless code, i.e., the encoded symbols used by any subsequent decoding algorithm.

The key insight in the design of $P^*_k$ is the fact that out of the k input symbols, n are already known at the decoding host. Given any encoded symbol Y* constructed at the encoding host 100 with degree i, the subtraction of step 1 above will result in Y' having, on average, a lower degree $$d' = i - i\frac{n}{k} = i\left(1-\frac{n}{k}\right)$$

symbols. The construction described above with respect the pre-encoding component nearly exactly compensates for this expected reduction in the degree of Y' by appropriately increasing the degree of the original encoded symbol in anticipation of the degree being reduced from i to $$d' = i\left(1-\frac{n}{k}\right).$$

The advantages of using the pre-encoding component 110 and the pre-decoding component 210 are presented in the following. The well known LT rateless code was selected for the comparison. It is shown through experimental results, obtained from a test implementation of the system illustrated in FIG. 2, that significant gains in terms of reduced number of encoded symbols required for recovering set $X_k$ at the decoding host are possible by employing the invention.

Figure 3:
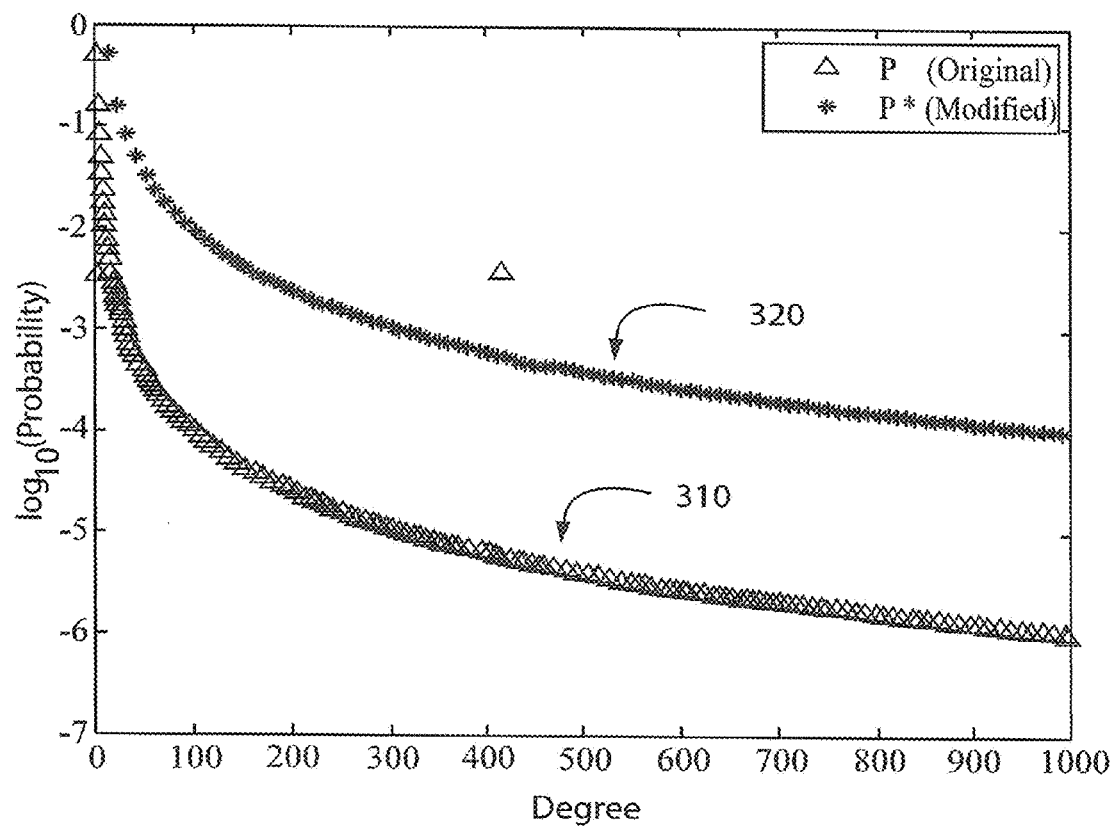

There were k=1000 input symbols at the encoding host set $X_k$, out of which n input symbols were available at the decoding host as elements of set $X_n^h$. Parameter n was varied in the experiment and n randomly chosen elements of set $X_k$ were chosen to populate different instances of set $X_n^h$. The LT rateless codes use the robust solution probability distribution, denoted by P. FIG. 3 illustrates non-zero values of the original P, identified by reference sign 310, and the Pt, identified by reference sign 320, as modified by the pre-encoding component 110. The values for lower degrees are spread by the pre-encoding component 110 and the values of P* are relatively greater than the corresponding values of P, according to the construction described above.

Figure 4:
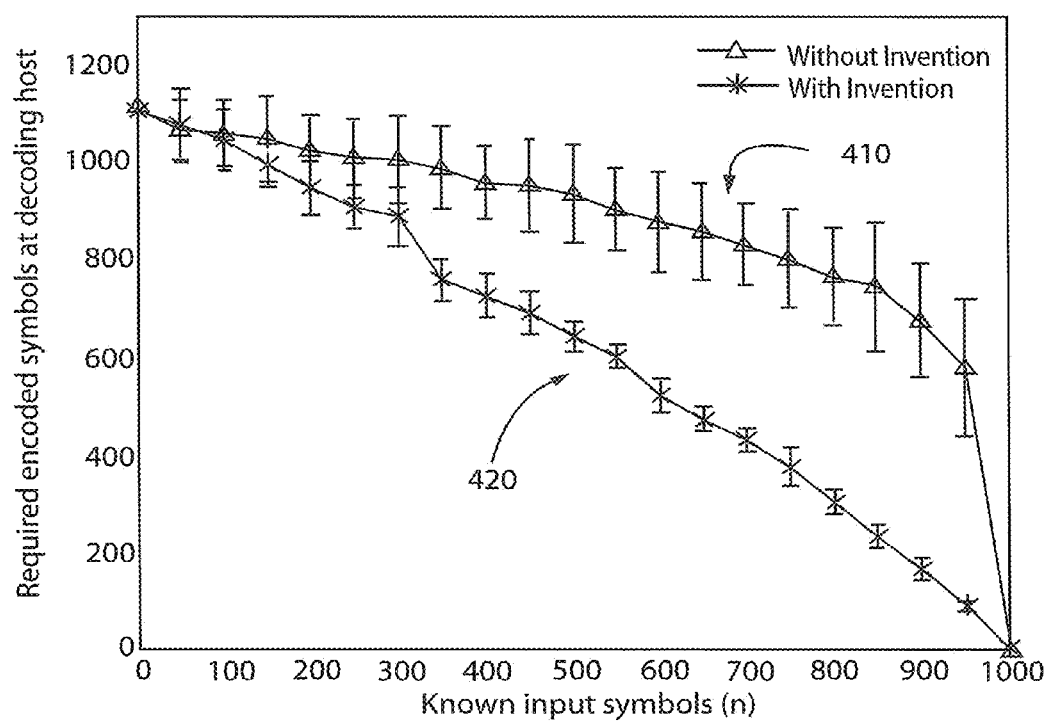

The number of encoded symbols required (number of elements in $Y^*_m$) to recover the entire set $X_k$ at the decoding host is plotted versus parameter n in FIG. 4. This experiment was repeated 100 times and error-bars showing the standard deviations of the number of required encoded symbols are also marked. The number of encoded symbols required when using the original LT code's probability distribution P, identified by reference signal 410, is almost always more than the number of encoded symbols required when using the probability distribution P* through the pre-encoding component 110 and pre-decoding component described above, identified by reference sign 420.

Thus, while there have been shown, described, and pointed out fundamental novel features of the invention as applied to several embodiments, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

The invention claimed is:
1. A method for data transmission from a transmitting host to at least one receiving host, wherein the transmitted data is coded for forward error correction, the method comprising the steps of:
   a) providing a pre-defined set $X_k$ of symbols, comprising k symbols, at the transmitting host;

b) providing an individual subset $X_n^h$ of said pre-defined set $X_k$, comprising $n_h$ symbols, at each of the at least one receiving host, wherein $h \in \{1, \ldots, H\}$ with H equaling a number of the at least one receiving host;

c) providing a pre-defined value n;

d) calculating a probability density $P^*_k$ having k components with a sum of 1, by the transmitting host, from a pre-defined probability density $P_{k-n}$ having k-n components with a sum of 1;

e) calculating an encoded symbol by the transmitting host by using an encoding algorithm based on a pre-defined rateless code depending on the pre-defined set $X_k$ of symbols, wherein the encoded symbol is associated with at least one randomly selected symbol of the set $X_k$, and wherein the number of symbols of set $X_k$ which are associated with the encoded signal is determined by using the probability density $P^*_k$;

f) transmitting, to each of the at least one receiving host, the calculated encoded symbol and information regarding which of the symbols of the set $X_k$ the calculated encoded symbol is associated with;

g) decoding the encoded symbol by each of the at least one receiving host using a decoding algorithm based on a pre-defined rateless code and corresponding to said encoding algorithm; and h) repeating steps e) through g) until each of the at least one receiving host has retrieved from the received encoded symbols a respective difference set of symbols $(X_k - X_n^h)$.

2. The method of claim 1, wherein the probability density $P^*_k$ is denser than the probability density $P_{k-n}$.

3. The method of claim 2, wherein the step of calculating the probability density $P^*_k$ from the probability density $P_{k-n}$ includes initially defining:

$$P^*_k[j]=0 \text{ for all } j \text{ with } 1 \leq j \leq k \text{ and}$$

calculating $P^*_k$ using an equation $$P^*_k[j] = P^*_k[j] + \sum_{constraints} P_{k-n}[i] \text{ for all } j \text{ with } 1 \leq j \leq k,$$

wherein the summation constraints are defined as:

$$1 \leq i \leq (k-n); \text{round}\left(\frac{i}{1-\frac{n}{k}}\right) = j.$$

4. The method of claim 1, wherein for at least two of the at least one receiving host at least one of the symbols of the respective individual subsets $X_n^h$ and a number of symbols $n_h$ in the respective individual subsets $X_n^h$ differ from each other.

5. The method of claim 1, wherein n is an estimate of respective values of $n_h$ defining a number of symbols of the individual subsets $X_n^h$.

6. The method of claim 5, wherein n is an estimate of the minimum of all of the $n_h$.

7. The method of claim 1, further comprising the steps of, prior to the decoding a received encoded symbol by each of the at least one receiving host:

determining the symbols which are associated with the received encoded symbol and are a member of the respective individual subset $X_n^h$ provided at the respective receiving host, and subtracting the determined symbols from the received encoded symbol.

8. The method of claim 1, further comprising the step of combining, by each of the at least one receiving host, the respective provided subset $X_n^h$ of symbols with the respective retrieved set of symbols $(X_k - X_n^h)$ so as to result in the set of symbols $X_k$.

9. The method of claim 1, wherein the pre-defined rateless code is a Luby transform code.

10. The method of claim 1, wherein a symbol size of the symbols is one byte.

11. The method of claim 1, wherein a symbol size of the symbols is larger than one byte.

12. A pre-encoding device for forward error correction encoding of data to be transmitted from a transmitting host to at least one receiving host, wherein a pre-defined set $X_k$ of symbols, comprising k symbols, is provided at the transmitting host, an individual subset $X_n^h$ of said pre-defined set $X_k$, comprising $n_h$ symbols is provided at each of the at least one receiving host, wherein $h \in \{1, \ldots, H\}$ with H being a number of at least one receiving host, and said forward error correction encoding is performed using a pre-defined rateless encoding algorithm, said pre-encoding device comprising:

a calculating device configured to calculate a probability density $P^*_k$ from a pre-defined probability density $P_{k-n}$, wherein said probability density $P_{k-n}$ has k-n components with a sum of 1 and said probability density $P^*_k$ has k components with a sum of 1.

13. The device of claim 12, wherein n is an estimate of respective values of $n_h$ defining a number of symbols of the individual subsets $X_n^h$.

14. The device of claim 13, wherein n is an estimate of a minimum of all $n_h$.

15. The device of claim 12, wherein the calculating device is configured to calculate said probability density $P^*_k$ from the probability density $P_{k-n}$ by initially defining $$P^*_k[j]=0 \text{ for all } j \text{ with } 1 \leq j \leq k \text{ and}$$

calculating $P^*_k$ using an equation $$P^*_k[j] = P^*_k[j] + \sum_{constraints} P_{k-n}[i] \text{ for all } j \text{ with } 1 \leq j \leq k,$$

wherein the summation constraints are defined as:

$$1 \leq i \leq (k'-n); \text{round}\left(\frac{i}{1-\frac{n}{k}}\right) = j.$$

16. A pre-decoding device for decoding forward error corrected data received from a transmitting host, wherein said forward error corrected data includes: at least one encoded symbol which is encoded using a pre-defined rateless encoding algorithm depending on a pre-defined set $X_k$ of symbols, comprising k symbols, wherein said encoded symbol is associated with at least one randomly selected symbol of the set $X_k$; and information with which of the symbols of the set $X_k$ the at least one encoded symbol is associated, said pre-decoding device comprising:

a symbol determining device configured to determine the symbols which are associated with the received at least one encoded symbol and are a member of a pre-defined subset $X_n^h$ of the symbols, and a subtracting device configured to subtract the determined symbols from the received at least one encoded symbol.

17. The device of claim 16, wherein the subtracting device is further configured to alter the information with which of the symbols of the set $X_k$ the at least one encoded symbol is associated by removing the information which defines the at least one encoded symbol to be associated with the determined symbols.

18. A transmission system for transmitting data with forward error correction, comprising:
a transmitting host including
a pre-encoding device for forward error correction encoding of data to be transmitted from a transmitting host to at least one receiving host, wherein a pre-defined set $X_k$ of symbols, comprising k symbols, is provided at the transmitting host, an individual subset $X_n^h$, of said pre-defined set $X_k$, comprising $n_h$ symbols is provided at each of the at least one receiving host, wherein h∈{1, . . . ,H} with H being a number of at least one receiving host, and said forward error correction encoding is performed using a pre-defined rateless encoding algorithm, said pre-encoding device comprising:
a calculating device configured to calculate a probability density $P^*_k$ from a pre-defined probability density $P_{k-n}$, wherein said probability density $P_{k-n}$ has k-n components with a sum of 1 and said probability density $P^*_k$ has k components with a sum of 1; and
an encoding device configured to encode data using an encoding algorithm based on a pre-defined rateless code; and
at least one receiving host, including:
a pre-decoding device for decoding forward error corrected data received from the transmitting host, wherein said forward error corrected data includes: at least one encoded symbol which is encoded using the pre-defined rateless encoding algorithm depending on the pre-defined set $X_k$ of symbols, wherein said encoded symbol is associated with at least one randomly selected symbol of the set $X_k$; and
information with which of the symbols of the set $X_k$ the at least one encoded symbol is associated, said pre-decoding device comprising:
a symbol determining device configured to determine the symbols which are associated with the received at least one encoded symbol and are a member of the pre-defined subset $X_n^h$ of the symbols; and
a subtracting device configured to subtract the determined symbols from the received at least one encoded symbol; and
a decoding device configured to decode data using a decoding algorithm based on the pre-defined rateless code and corresponding to said encoding algorithm.

19. The system of claim 18, wherein the pre-defined rateless code is a Luby transform code.

* * * * *